(12) United States Patent
Arnaud et al.

(10) Patent No.: US 6,680,682 B2
(45) Date of Patent: Jan. 20, 2004

(54) PROCESS FOR THE ANALOG/DIGITAL CONVERSION OF AN ANALOG SIGNAL WITHIN A TERMINAL OF A WIRELESS COMMUNICATION SYSTEM, FOR EXAMPLE A MOBILE TELEPHONE, AND CORRESPONDING TERMINAL

(75) Inventors: Thierry Arnaud, Poisy (FR); Friedbert Berens, Geneva (CH)

(73) Assignee: STMicroelectronics N.V., Amsterdam (NL)

( * ) Notice: Subject to any disclaimer, the term of this patent is extended or adjusted under 35 U.S.C. 154(b) by 0 days.

(21) Appl. No.: 10/113,837

(22) Filed: Apr. 1, 2002

(65) Prior Publication Data

US 2002/0145551 A1 Oct. 10, 2002

(30) Foreign Application Priority Data

Apr. 2, 2001 (EP) ............................ 01107741

(51) Int. Cl.⁷ ............................................ H03M 1/12
(52) U.S. Cl. .................. 341/155; 341/143; 341/139; 455/424; 425/106; 375/28; 375/350
(58) Field of Search ................. 341/143, 155, 341/157, 139; 455/424; 725/106; 375/28, 350

(56) References Cited

U.S. PATENT DOCUMENTS

| 5,220,327 A | * | 6/1993 | Abbiate et al. | 341/143 |
|---|---|---|---|---|
| 5,329,553 A | * | 7/1994 | Abbiate et al. | 341/143 |
| 5,757,300 A | * | 5/1998 | Koilpillai et al. | 341/143 |
| 6,148,048 A | * | 11/2000 | Kerth et al. | 375/350 |
| 6,157,329 A | * | 12/2000 | Lee et al. | 341/143 |
| 6,160,859 A | * | 12/2000 | Martin et al. | 341/143 |
| 6,271,780 B1 | * | 8/2001 | Gong et al. | 341/139 |
| 6,334,219 B1 | * | 12/2001 | Hill et al. | 725/106 |
| 6,476,743 B1 | * | 11/2002 | Brown et al. | 341/123 |
| 6,487,405 B1 | * | 11/2002 | Dapper | 455/424 |

FOREIGN PATENT DOCUMENTS

WO          01/03312          1/2001          ............ H04B/1/16

* cited by examiner

Primary Examiner—Michael Tokar
Assistant Examiner—Lam T. Mai
(74) Attorney, Agent, or Firm—Lisa K. Jorgenson; Allen, Dyer, Doppelt, Milbrath & Gilchrist, P.A.

(57) ABSTRACT

A remote terminal includes a receiver stage for receiving a transmitted signal and for delivering an analog signal. The remote terminal further includes an analog/digital converter for converting the analog signal to a digital signal, and a processing stage for processing the digital signal. The analog/digital converter is a delta-sigma converter having adjustable parameters, and the processing stage includes a tuning circuit for adjusting these parameters on the fly as a function of the transmission standard, of the actual rate of transmission of the useful data, and of the actual conditions of reception.

38 Claims, 3 Drawing Sheets

PROCESS FOR THE ANALOG/DIGITAL CONVERSION OF AN ANALOG SIGNAL WITHIN A TERMINAL OF A WIRELESS COMMUNICATION SYSTEM, FOR EXAMPLE A MOBILE TELEPHONE, AND CORRESPONDING TERMINAL

FIELD OF THE INVENTION

The present invention relates to wireless communication systems, and more particularly, to a universal mobile telecommunication system (UMTS) in which several transmission standards are taken into account by a terminal. These standards include GSM, GPRS and WCDMA.

BACKGROUND OF THE INVENTION

In a wireless communication system, a base station communicates with a plurality of remote terminals, such as cellular mobile telephones. Frequency division multiple access (FDMA) and time division multiple access (TDMA) are the traditional multiple access schemes for delivering simultaneous services to a number of terminals. The basic idea underlying FDMA and TDMA systems is sharing the available resource (sharing several frequencies for FDMA systems or sharing several time intervals for TDMA systems) in such a way that several terminals can operate simultaneously without causing interference.

In contrast to these schemes using frequency division or time division, the CDMA schemes allow multiple users to share a common frequency and a common time channel by using coded modulation. More precisely, as is well known to the person skilled in the art, a scrambling code is associated with each base station. This makes it possible to distinguish one base station from another. Furthermore, an orthogonal code, known by the person skilled in the art as an OVSF code, is allotted to each remote terminal, such as for a cellular mobile telephone. All the OVSF codes are mutually orthogonal, thus making it possible to distinguish one remote terminal from another.

Before sending a signal over the transmission channel to a remote terminal, the signal has been scrambled and spread by the base section using the scrambling code of the base station and the OVSF code of the remote terminal. In CDMA systems, it is again possible to distinguish between those which use a distinct frequency for transmission and reception (CDMA-FDD system), and those which use a common frequency for transmission and reception but distinct time domains for transmission and reception (CDMA-TDD system).

Third-generation terminals, such as cellular mobile telephones, must be compatible with the UMTS standard, that is, they must be capable of operating under various wireless transmission standards. Thus, they will have to be capable of operating in a system of the FDMA/TDMA type, according, for example, to the GSM or GPRS transmission standard, or else in communication systems of the CSMA-FDD, CSMA-TDD type by using, for example, the UTRA-FDD or UTRA-TDD or IS-95 transmission standards.

It is therefore important to reduce or minimize the number of electronic components in these terminals, so as to reduce their complexity of integration and power consumption to obtain greater autonomy.

SUMMARY OF THE INVENTION

In view of the foregoing background, the invention therefore proposes a process for the analog/digital conversion of an analog signal delivered by a reception stage of a terminal of a wireless communication system, for example, a cellular telephone. According to a general characteristic of the invention, the conversion is performed in a delta-sigma type converter, and the parameters of the converter are adjusted on the fly as a function of the transmission standard, the actual rate of transmission of the useful data and the actual conditions of reception.

The invention therefore proposes to use just one converter which is adaptable and flexible. This single converter is a delta-sigma converter having adjustable parameters. Also, since just one analog/digital converter is required to support a number of wireless communication systems, such as CDMA, TDMA, FDMA systems, for example, the complexity of implementation of the terminal is substantially reduced.

Furthermore, the use of a delta-sigma converter also makes it possible to modify the resolution of the converter as a function of the actual rate of transmission of the useful data, that is, the services transmitted. For example, the services transmitted include transmission of data or speech or cell searching in an UTRA transmission standard. The modification of the resolution of the converter can also be adapted as a function of the actual conditions of reception, that is, for example, of the environmental conditions (reception level, type of environment, etc.).

In certain cases it is possible to reduce the resolution of the converter by one or two bits, while satisfying acceptable conditions of reception with regards to the service requested. However, it has been observed that a decrease in resolution by 1 bit could lead to a reduction on the order of 30 to 40% in the consumption of current.

A delta-sigma converter comprises a delta-sigma modulator having adjustable parameters. This modulator includes a sampler, as well as a parametrizable digital output filter connected at the output of the modulator. According to one mode of implementation of the invention, the parameters of the modulator are adjusted as a function of the desired transmission standard. The coefficients of the output filter and the value of the oversampling frequency of the sampler are adjusted as a function of the desired resolution with regards to the actual rate of transmission of the useful data and the actual conditions of reception.

The delta-sigma modulator also generally includes a loop having loop coefficients. This loop includes the sampler and at least one integrator. The adjustment of the parameters of the modulator can then include an adjustment of the loop coefficients and of the value of the oversampling frequency.

Selection between the various resolutions and the various passbands of the signal (corresponding to the various transmission standards), may be controlled by the software used in the digital processing stage which follows the analog/digital converter. By measuring the block error rate, which is a measurement representative of the binary error rate of the signal, it is possible to obtain a good estimate of the environmental conditions. Also, the modification of the resolution and the checking of the new values of resolution can be based on these measurements.

More precisely, according to one mode of implementation of the invention, a measurement representative of the binary error rate of the signal is performed. This measured value is compared with a reference value, which depends for example on the service transmitted, such as speech, low throughput data transmission, etc. Also, if the measured value is less than the reference value, this signifies that there may be a certain margin for decreasing the resolution of the converter.

The parameters of the converter are then adjusted in such a way as to decrease the resolution of the converter in successive notches. Also, at each notch the resolution is checked via a new measurement representative of the binary error rate. Thus, by way of example, if there is an actual rate of transmission of useful data corresponding to a high-quality data transmission service, the reference value of the binary error rate is then specified at $10^{-6}$. Also, if the converter is tuned for a resolution of 8 bits and should a binary error rate equal to $10^{-8}$ be measured for example, the resolution can first be reduced to 7 bits. If the new binary error rate is still less than $10^{-6}$, it is then possible to attempt to reduce the resolution to 6 bits. One generally does not proceed below 4 bits for such a service, until a measured binary error rate, which is compatible with the reference error rate required for this service, is obtained.

The subject of the invention is also directed to a terminal of a wireless communication system, for example, a cellular mobile telephone, comprising a reception stage able to receive a transmitted signal and to deliver an analog signal. An analog/digital converter converts the analog signal to a digital signal, and a processing stage processes the digital signal delivered by the converter.

According to a general characteristic of the invention, the converter is a parametrizable delta-sigma converter, and the processing stage comprises tuning means able to adjust the parameters of the converter on the fly as a function of the transmission standard, the actual rate of transmission of the useful data and the actual conditions of reception.

According to one embodiment of the invention, the delta-sigma converter comprises a parametrizable delta-sigma modulator which includes a sampler, as well as an output filter. The tuning means include first means of adjustment for adjusting the parameters of the modulator as a function of the transmission standard, and second means of adjustment for adjusting the coefficients of the output filter and the value of the oversampling frequency of the sampler as a function of the desired resolution with regards to the actual rate of transmission of the useful data and the actual conditions of reception.

According to one embodiment of the invention, the delta-sigma modulator includes a loop having loop coefficients. The modulator also includes the sampler and at least one integrator. The first means of adjustment are then able to adjust the loop coefficients and the value of the oversampling frequency. The first means of adjustment may also adjust the value of the capacities of the integrators.

According to one embodiment of the invention, the second means of adjustment include a memory storing reference values representative of various reference binary error rates associated with various transmission characteristics, and measurement means able to perform a measurement representative of the binary error rate of the signal.

The second means of adjustment further includes comparison means able to compare this measured value with a reference value, and checking means. If the measured value is less than the reference value, the checking means adjust the parameters of the converter in such a way as to decrease the resolution of the converter in successive notches, and to check at each notch the new resolution on the basis of a new measurement value delivered by the measurement means.

BRIEF DESCRIPTION OF THE DRAWINGS

Other advantages and characteristics of the invention will become apparent on examining the detailed description on modes of implementation and embodiments which are in no way limiting, and the appended drawings in which.

DETAILED DESCRIPTION OF THE PREFERRED EMBODIMENTS

Figure 1:
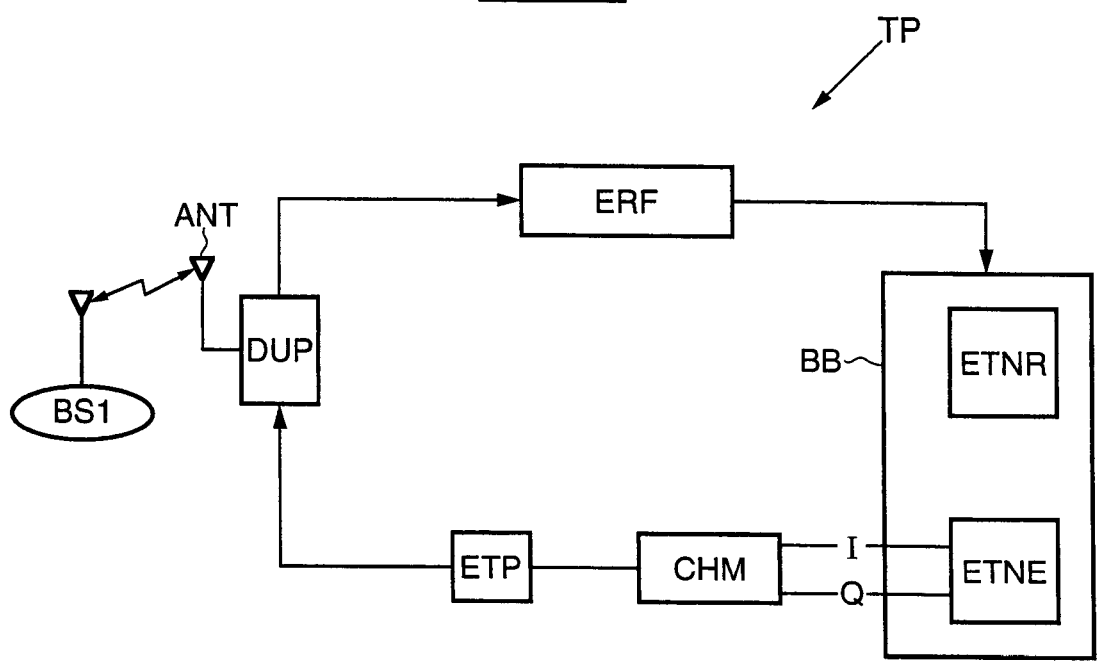
FIG. 1 is a block diagram illustrating the structure of a cellular mobile telephone system according to the present invention.

In FIG. 1, the reference TP designates a remote terminal, such as a cellular mobile telephone, which is in communication with a base station BS1, for example, according to a communication scheme of the CDMA-FDD type (for example, UTRA-FDD standard). The cellular mobile telephone comprises, in a conventional manner, a radio frequency analog stage ERF connected to an antenna ANT by way of a duplexer DUP for receiving an input signal ISG (FIG. 2).

Figure 2:
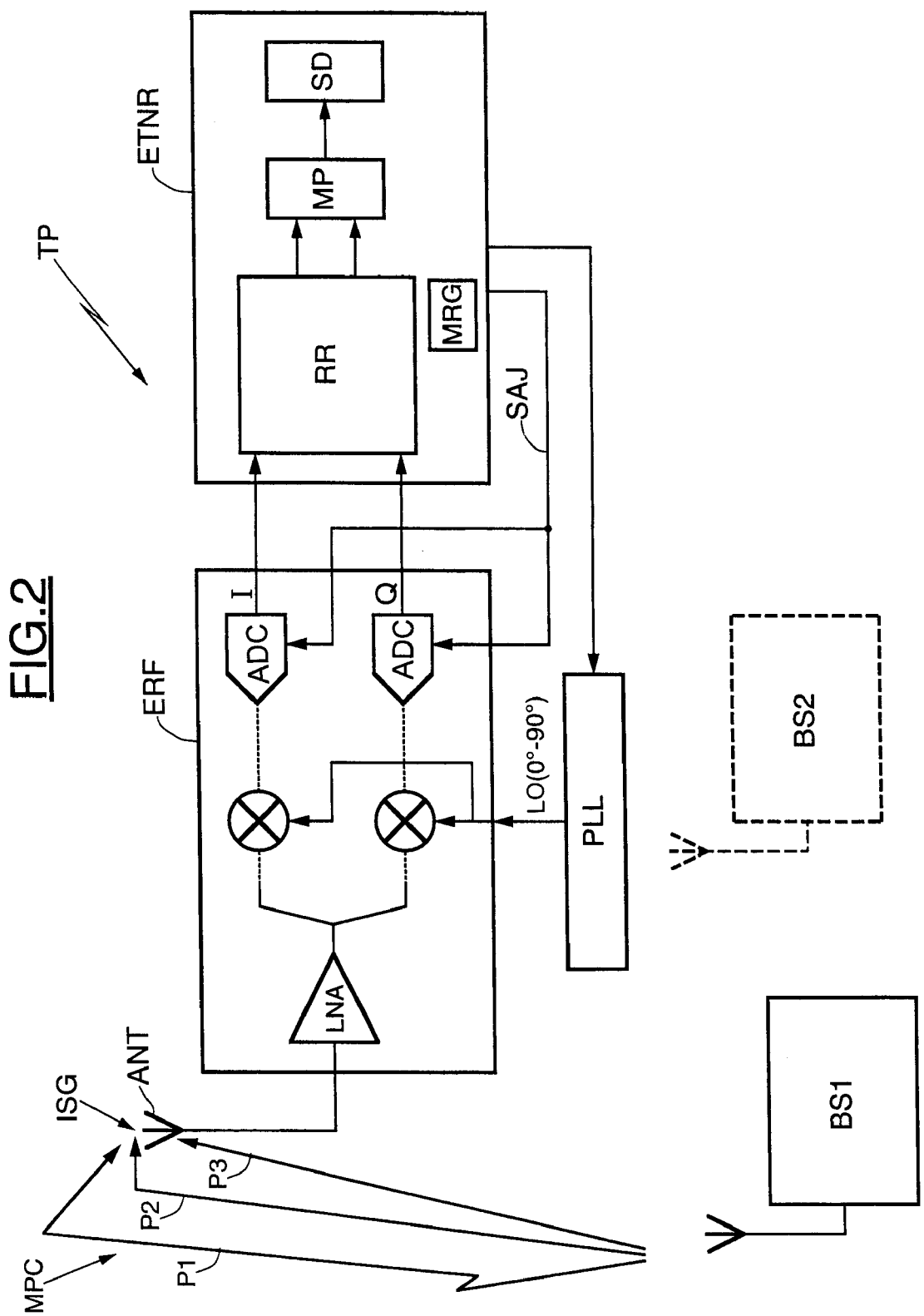
FIG. 2 is a more detailed block diagram of the cellular mobile telephone system illustrated in FIG. 1.

Conventionally, the analog stage ERF comprises (FIG. 2) a low noise amplifier LNA and two processing pathways including mixers, conventional filters and amplifiers (not represented in FIG. 2 for the sake of simplification). The two mixers respectively receive from a phase-locked loop PLL two signals exhibiting a 90° mutual phase difference. After frequency transposition in the mixers, the two processing pathways respectively define two streams I (direct stream) and Q (quadrature stream) according to terminology well known to those skilled in the art.

After digital conversion in analog/digital converters ADC, the two streams I and Q are delivered to a reception processing stage ETNR. This processing stage ETNR comprises, in a conventional manner, a receiver RR, commonly designated by the person skilled in the art as a Rake receiver, followed by conventional means of demodulation MP which perform the demodulation of the signals delivered by the Rake receiver RR.

Due to the possible reflections of the signal initially off obstacles lying between the base station and the mobile telephone, the transmission medium is a multipath transmission medium MPC. That is, one which comprises several different transmission routes. Three transmission routes P1, P2, P3 are represented in FIG. 2. Consequently, the signal ISG which is received by the mobile telephone comprises various time delayed versions of the signal initially transmitted. The versions are the result of the multipath transmission characteristics of the transmission medium. Also, each path introduces a different delay.

The Rake receiver RR, with which a cellular mobile telephone operating in a CDMA communication system is equipped, is used to perform the time delayed alignment, the descrambling, the despreading and the combining of the delayed versions of the initial signals, so as to deliver the information streams contained in the initial signals. Of course, the received signal ISG could also result from the transmission of initial signals respectively transmitted by various base stations, BS1 and BS2.

The processing stage ETNR also comprises in a conventional manner a source decoder SD which performs a source decoding which is well known to the person skilled in the art. As is also well known to the person skilled in the art, the phase-locked loop PLL is controlled by an automatic frequency-control algorithm incorporated into a processor of the processing stage ETNR.

Referring again more particularly to FIG. 1, the baseband processing block BB includes, in addition to the processing stage ETNR, a transmission processing stage ETNE which performs, in a conventional manner, the processing operations of source coding, spreading of the symbols, and modulation. This is done so as to deliver the two streams I and Q to transmission circuitry CHM having conventional structure.

This transmission circuitry CHM includes at the front end, digital/analog converters, as well as mixers making it possible to perform a frequency transposition to the transmission frequency. Here again, the transposition signals are delivered by a phase-locked loop (not represented here for the sake of simplification) likewise controlled by automatic frequency-control means incorporated into the stage ETNE. The circuitry CHM is conventionally followed by a power amplifier stage ETP connected to the antenna by the duplexer DUP.

Returning now to the stage ETNR, this stage also includes tuning means MRG incorporated in software within the processor of the stage ETNR. The tuning means deliver an adjustment signal SAJ to the converters ADC so as to adjust their parameters as a function of the transmission standard used, the service used and the environmental conditions of reception.

Figure 3:
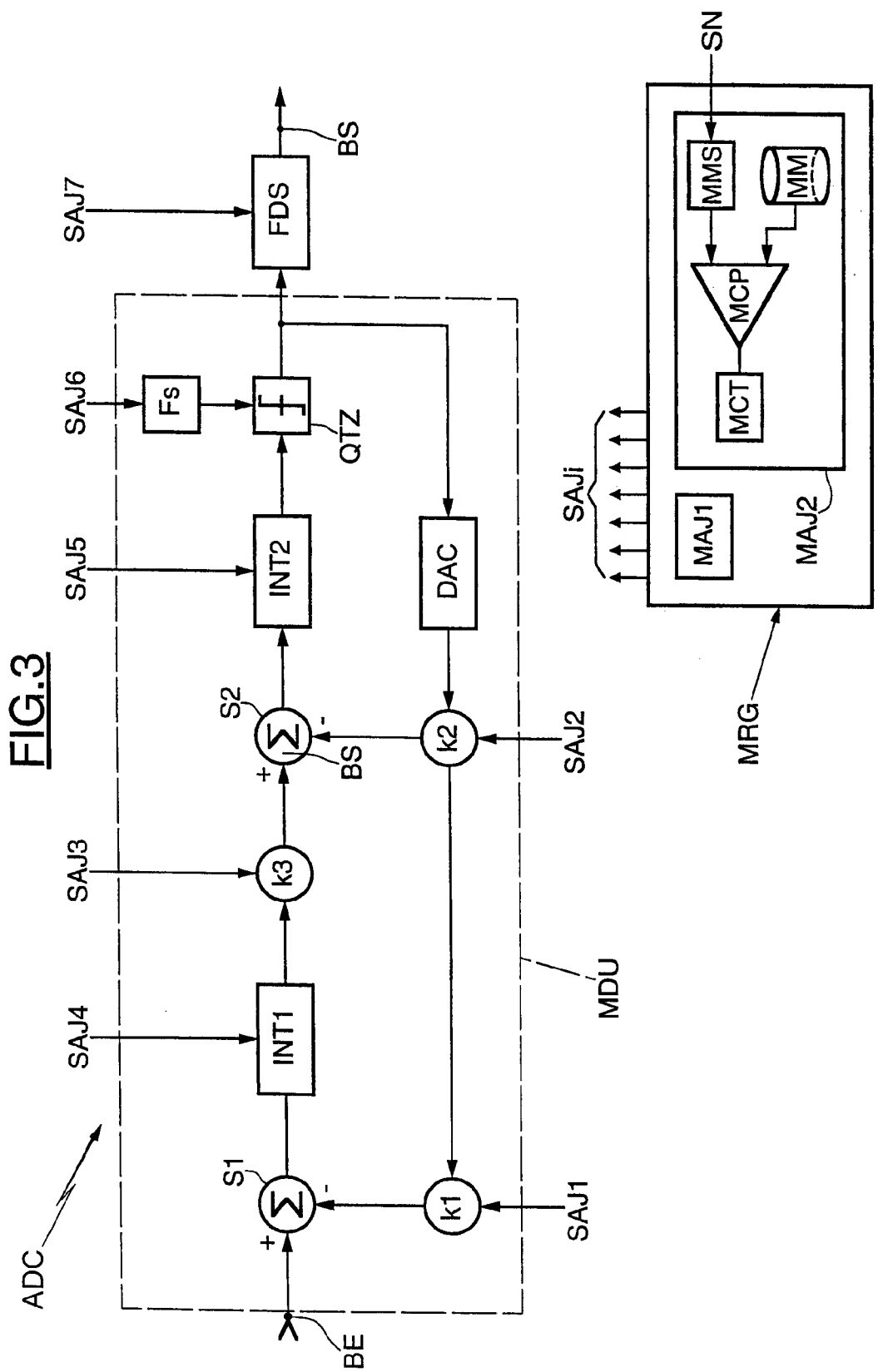
FIG. 3 is a detailed block diagram of the analog/digital converter and the circuit for tuning the parameters of the converter, as illustrated in FIG. 2.

One of the two converters ADC will now be described in greater detail. The two converters are identical. The converter ADC used in the terminal according to the invention, which is illustrated in FIG. 3, is a delta-sigma converter. In FIG. 3, the delta-sigma converter ADC is of order 2, since it includes two integrators. However, the invention applies to any type of delta-sigma converter irrespective of its order.

The structure of an analog/digital delta-sigma converter is conventional and known to the person skilled in the art. Its principal characteristics are briefly recalled here. The role of the analog/digital delta-sigma converter is to convert an analog input signal into a digital output signal at a specified sampling frequency. The delta-sigma converter includes at the front end a delta-sigma modulator MDU, and connected to the output thereof are decimating output filters FDS, such as finite impulse response filters for example. The input terminal BE of the converter ADC is also the input terminal of the delta-sigma modulator MDU. The modulator MDU can deliver at its output a sampled signal on one, or even 2 bits. The oversampling frequency Fs is much greater than the output sampling frequency. The successive samples of 1 (or 2 bits) are delivered to the decimating filter FDS in tempo with the oversampling frequency.

The modulator MDU includes at the front end a first summing circuit S1 (subtractor) linked to the input terminal BE. This first summing circuit is followed by a first integrator INT1 whose output is linked to the input of a second summing circuit S2 (subtractor) by way of a loop coefficient k3. The output of the second summing circuit S2 is linked to the input of a second integrator INT2 which is followed by a quantization circuit QTZ (sampler) whose output forms the output of the modulator MDU. The output of the quantization means QTZ is looped back onto the other two inputs of the two summing circuits S1 and S2 by way of a digital/analog converter ADC and two other loop coefficients k1 and k2. The DELTA modulation is based on the quantization of the modification of the signal from sample to sample, rather than on the quantization of the absolute value of the signal at each sample.

The presence of an integrator (sigma) in the modulator is what gives the modulator the delta-sigma modulator name. The output of the delta-sigma modulator is at a very high oversampling frequency Fs. This is a fundamental characteristic of delta-sigma modulators since they use the high-frequency portion of the spectrum to repel the major part of the quantization noise. Specifically, a delta-sigma modulator is designed to repel the quantization noise out of the band of the useful signal.

The frequency response of the modulator, that is, the manner in which the quantization noise is repelled at high frequency, may be modified as a function of the transmission standard by programming the various loop parameters of the modulator (k1, k2, k3, INT1, INT2) as well as the frequency Fs. The conversion of the oversampled output signal from the delta-sigma modulator on one or two bits to a signal having a lower bit rate but a higher number of bits is then carried out in the decimating filters FDS. The function of these filters include eliminating the quantization noise situated outside the useful signal band so as to leave only a small portion of the quantization noise of the useful signal band performing a decimation, that is a reduction of the oversampling frequency. This amounts to increasing the effective resolution of the output.

One approach for performing these functions includes using a digital type decimating filter. An economical and simple way includes using a comb decimating filter, the structure of which is well known to the person skilled in the art. This comb filter is simply a finite impulse response filter all of whose coefficients are equal to 1, and which behaves as a simple accumulator performing a sliding average. The use of a comb decimating filter has the advantage, in particular, of not requiring any multiplier or of needing any storage for the coefficients of the filter. This filter is then followed by a digital filter eliminating the residual noise lobes of the comb filter.

At the output terminal BS of the filter, the digital signal is formed of samples (words) whose length defines the resolution of the converter. This resolution may be 13 bits for a GSM or DCS transmission standard, for example, or else 8 bits for a high-quality data transmission service in a UTRA-FDD transmission standard.

An essential characteristic of the invention is that the parameters of the analog/digital converter ADC can be adjusted by the tuning means MRG as a function of the transmission standard, of the service required (rate of transmission of the useful data) and of the actual conditions of transmission (environment, interference etc.).

In this regard, it is possible to act on the parameters of the delta-sigma modulator MDU and/or the coefficients of the output filter FDS. More precisely, as may be seen in FIG. 3, the loop coefficients k1, s2 and k3, as well as the oversampling frequency Fs, and possibly the capacities of the integrators INT1 and INT2, may be adjusted by the adjustment signals SAJ1–SAJ6.

By adjusting the adjusting the signals SAJ1–SAJ6, it is possible to adapt the converter to the passband of the signal, that is, to the transmission standard used. Thus, the converter according to the invention can be used in a UMTS telephone capable of operating according to the GSM, DCS or UTRA transmission standards. The person skilled in the art is aware that the passband of the baseband analog signal is 200 kilohertz for the GSM and DCS standards, and 3.84 megahertz for the WDCMA systems (UTRA transmission standard).

The person skilled in the art is fully aware of how to determine the values of the coefficients k1, s2 and k3, the value of the oversampling frequency Fs and optionally the values of the capacities of the integrators INT1 and INT2 so as to adapt the converter to a given passband of the analog signal. This calculation can be performed in the first means of adjustment MAJ1, for example, via software within a processor, or else by using pre-stored look-up tables. The adjustment of the coefficients of the output filters FDS and the adjustment of the value of the oversampling frequency Fs make it possible to modify the value of the resolution of the converter. Here again, the person skilled in the art is aware of how to parametrize the coefficients of the filter, and the value of the oversampling frequency Fs so as to obtain a desired resolution.

This aspect of the invention thus makes it possible to adapt the resolution of the converter to the type of service required. Thus, in a UTRA transmission standard, the resolution required during a search for cells can be reduced to 1 or 2 bits. It can also be reduced to 2 bits in a so-called discontinuous mode of reception, well known to the person skilled in the art by the initials DRX.

Moreover, in a WCDMA system, the resolution required may be different depending on the service offered. The resolution may be 6 bits for a speech transmission, and 8 bits for a high-quality data transmission. Within the same service, the resolution may optionally be decreased if the reception conditions lead to the measured binary error rate being less than the reference binary error rate required for this service.

As illustrated in FIG. 3, the second means of adjustment MAJ2 include measurement means MMS capable of measuring the block error rate (BLER) of the digital signal SN (which is representative of the binary error rate BER of the signal), and of comparing it with a reference value stored in a memory MM. The output of the comparison means MCP is linked to checking means MCT which will, if this measured value of the block error rate is less than the reference value, decrease the resolution by 1-bit notches until it comes close to, while remaining less than, the reference value.

Thus, it is possible for the same service to reduce the resolution if the environmental conditions so permit, and thus to reduce the power consumed by the converter and consequently by the telephone. By way of example, for a speech service, the resolution may lie between 1 and 6 bits whereas it will generally have to lie between 4 and 8 bits for a high-quality data transmission service.

The invention is not limited to the embodiment described, but embraces all variations thereof. Thus, the parametrizable analog/digital conversion according to the invention can also be carried out in the base station.

What is claimed is:

1. A process for an analog/digital conversion of a transmitted analog signal received by a receiver of a wireless communication system, the process comprising:
    applying the analog signal to a delta-sigma analog/digital converter having adjustable parameters; and
    adjusting the parameters on the fly as a function of a transmission standard of the transmitted analog signal, of a transmission rate of data in the received analog signal, and of reception conditions for the received analog signal.

2. A process according to claim 1, wherein the delta-sigma analog/digital converter comprises a delta-sigma modulator having adjustable parameters, and a digital filter having adjustable coefficients connected to an output of the delta-sigma modulator, and the delta-sigma modulator comprises a sampler circuit having an adjustable oversampling frequency; and wherein the adjusting comprises:
    adjusting the parameters of the delta-sigma modulator as a function of the transmission standard; and
    adjusting the coefficients of the digital filter and adjusting a value of the oversampling frequency as a function of the transmission rate of data in the received analog signal and of reception conditions for the received analog signal.

3. A process according to claim 2, wherein the delta-sigma modulator comprises a loop including the sampler circuit and at least one integrator connected thereto, with the loop having at least one loop coefficient; and wherein the adjusting comprises adjusting the at least one loop coefficient and the value of the oversampling frequency.

4. A process according to claim 1, further comprising:
    measuring a binary error rate of the transmitted analog signal;
    comparing the measured binary error rate with a reference value; and
    if the measured binary error rate is less than the reference value, then the parameters are adjusted to decrease a resolution of the delta-sigma analog/digital converter in successive intervals, and at each interval a new resolution is checked via a new measurement representative of the binary error rate.

5. A process according to claim 1, wherein the transmission standard comprises a universal mobile telecommunications system standard.

6. A process for an analog/digital conversion of an analog signal received by a cellular mobile telephone, the process comprising:
    applying the analog signal to a delta-sigma analog/digital converter having adjustable parameters; and
    adjusting the parameters on the fly as a function of at least one of a transmission standard of the received analog signal, of a transmission rate of data in the received analog signal, and of reception conditions for the received analog signal.

7. A process according to claim 6, wherein the delta-sigma analog/digital converter comprises a delta-sigma modulator having adjustable parameters, and a digital filter having adjustable coefficients connected to an output of the delta-sigma modulator, and the delta-sigma modulator comprises a sampler circuit having an adjustable oversampling frequency; and wherein the adjusting comprises:
    adjusting the parameters of the delta-sigma modulator as a function of the transmission standard; and
    adjusting the coefficients of the digital filter and adjusting a value of the oversampling frequency as a function of the transmission rate of data in the received analog signal and of reception conditions for the received analog signal.

8. A process according to claim 7, wherein the delta-sigma modulator comprises a loop including the sampler circuit and at least one integrator connected thereto, with the loop having at least one loop coefficient; and wherein the adjusting comprises adjusting the at least one loop coefficient and the value of the oversampling frequency.

9. A process according to claim 6, further comprising:
    measuring a binary error rate of the transmitted analog signal;
    comparing the measured binary error rate with a reference value; and
    if the measured binary error rate is less than the reference value, then the parameters are adjusted to decrease a resolution of the delta-sigma analog/digital converter in successive intervals, and at each interval a new resolution is checked via a new measurement representative of the binary error rate.

10. A process according to claim 6, wherein the transmission standard comprises a universal mobile telecommunications system standard.

11. A wireless communication device comprising:
a receiver stage for receiving a transmitted analog signal, and comprising a delta-sigma analog/digital converter for converting the analog signal to a digital signal, said delta-sigma analog/digital converter having adjustable parameters; and
a processing stage connected to said receiver stage for processing the digital signal, and comprising a tuning circuit for adjusting the parameters on the fly as a function of at least one of a transmission standard of the transmitted analog signal, of a transmission rate of data in the received analog signal, and of reception conditions for the received analog signal.

12. A wireless communication device according to claim 11, wherein said delta-sigma analog/digital converter comprises:
a delta-sigma modulator having adjustable parameters, and comprising a sampler circuit having an adjustable oversampling frequency; and
a digital filter having adjustable coefficients connected to an output of said delta-sigma modulator.

13. A wireless communication device according to claim 12, wherein said tuning circuit comprises:
a first adjustment circuit for adjusting the parameters of said delta-sigma modulator as a function of the transmission standard; and
a second adjustment circuit for adjusting the coefficients of said digital filter and a value of the oversampling frequency as a function of the transmission rate of data in the received analog signal and of reception conditions for the received analog signal.

14. A wireless communication device according to claim 13, wherein said delta-sigma modulator comprises a loop including said sampling circuit and at least one integrator connected thereto, with the loop having at least one loop coefficient; and wherein said first adjustment circuit adjusts the at least one loop coefficient and the value of the oversampling frequency.

15. A wireless communication device according to claim 13, wherein said second adjustment circuit comprises:
a memory for storing a plurality of reference values representative of a plurality of reference binary error rates associated with a plurality of transmission characteristics;
a measurement circuit for measuring a binary error rate of the transmitted analog signal;
a comparison circuit connected to said memory and to said measurement circuit for comparing a measured binary error rate to a reference value; and
a checking circuit connected to said comparison circuit for checking if the measured binary error rate is less than the reference value, and if so, then the parameters are adjusted to decrease a resolution of said delta-sigma analog/digital converter in successive intervals, and at each interval a new resolution is checked via a new measurement representative of the binary error rate.

16. A wireless communication device according to claim 13, wherein the wireless communication device is a cellular mobile telephone.

17. A wireless communication device according to claim 13, wherein the transmission standard comprises a universal mobile telecommunications system standard.

18. A cellular mobile telephone comprising:
a receiver stage for receiving a transmitted analog signal, and comprising a delta-sigma analog/digital converter for converting the analog signal to a digital signal, said delta-sigma analog/digital converter having adjustable parameters; and
a processing stage connected to said receiver stage for processing the digital signal, and comprising a tuning circuit for adjusting the parameters on the fly as a function of at least one of a transmission standard of the transmitted analog signal, of a transmission rate of data in the received analog signal, and of reception conditions for the received analog signal.

19. A cellular mobile telephone according to claim 18, wherein said delta-sigma analog/digital converter comprises:
a delta-sigma modulator having adjustable parameters, and comprising a sampler circuit having an adjustable oversampling frequency; and
a digital filter having adjustable coefficients connected to an output of said delta-sigma modulator.

20. A cellular mobile telephone according to claim 19, wherein said tuning circuit comprises:
a first adjustment circuit for adjusting the parameters of said delta-sigma modulator as a function of the transmission standard; and
a second adjustment circuit for adjusting the coefficients of said digital filter and a value of the oversampling frequency as a function of the transmission rate of data in the received analog signal and of reception conditions for the received analog signal.

21. A cellular mobile telephone according to claim 19, wherein said delta-sigma modulator comprises a loop including said sampling circuit and at least one integrator connected thereto, with the loop having at least one loop coefficient; and wherein said first adjustment circuit adjusts the at least one loop coefficient and the value of the oversampling frequency.

22. A cellular mobile telephone according to claim 19, wherein said second adjustment circuit comprises:
a memory for storing a plurality of reference values representative of a plurality of reference binary error rates associated with a plurality of transmission characteristics;
a measurement circuit for measuring a binary error rate of the transmitted analog signal;
a comparison circuit connected to said memory and to said measurement circuit for comparing a measured binary error rate to a reference value; and
a checking circuit connected to said comparison circuit for checking if the measured binary error rate is less than the reference value, and if so, then the parameters are adjusted to decrease a resolution of said analog/digital converter in successive intervals, and at each interval a new resolution is checked via a new measurement representative of the binary error rate.

23. A cellular mobile telephone according to claim 14, wherein the transmission standard comprises a universal mobile telecommunications system standard.

24. A process for an analog/digital conversion of an analog signal received by a cellular mobile telephone, the process comprising:
applying the analog signal to a delta-sigma analog/digital converter comprising a delta-sigma modulator having adjustable parameters, and a digital filter having adjustable coefficients connected to an output of the delta-sigma modulator, and the delta-sigma modulator comprising a sampler circuit having an adjustable oversampling frequency;

adjusting the parameters of the delta-sigma modulator as a function of the transmission standard; and adjusting the coefficients of the digital filter and adjusting a value of the oversampling frequency as a function of the transmission rate of data in the received analog signal and of reception conditions for the received analog signal.

25. A process according to claim 24, wherein the delta-sigma modulator comprises a loop including the sampler circuit and at least one integrator connected thereto, with the loop having at least one loop coefficient; and further comprising adjusting the at least one loop coefficient.

26. A process according to claim 24, further comprising:
measuring a binary error rate of the transmitted analog signal;
comparing the measured binary error rate with a reference value; and
if the measured binary error rate is less than the reference value, then the parameters are adjusted to decrease a resolution of the delta-sigma analog/digital converter in successive intervals, and at each interval a new resolution is checked via a new measurement representative of the binary error rate.

27. A process according to claim 24, wherein the transmission standard comprises a universal mobile telecommunications system standard.

28. A wireless communication device comprising:
a receiver stage for receiving a transmitted analog signal, and comprising a delta-sigma analog/digital converter for converting the analog signal to a digital signal, said delta-sigma analog/digital converter comprising
a delta-sigma modulator having adjustable parameters, and comprising a sampler circuit having an adjustable oversampling frequency, and
a digital filter having adjustable coefficients connected to an output of said delta-sigma modulator; and
a processing stage connected to said receiver stage for processing the digital signal, and comprising a tuning circuit for adjusting the parameters of said delta-sigma modulator as a function of a transmission standard, and for adjusting the coefficients of said digital filter and for adjusting a value of the oversampling frequency as a function of the transmission rate of data in the received analog signal and of reception conditions for the received analog signal.

29. A wireless communication device according to claim 28, wherein said tuning circuit comprises:
a first adjustment circuit for adjusting the parameters of said delta-sigma modulator; and
a second adjustment circuit for adjusting the coefficients of said digital filter and the value of the oversampling frequency.

30. A wireless communication device according to claim 29, wherein said delta-sigma modulator comprises a loop including said sampling circuit and at least one integrator connected thereto, with the loop having at least one loop coefficient; and wherein said first adjustment circuit adjusts the at least one loop coefficient and the value of the oversampling frequency.

31. A wireless communication device according to claim 29, wherein said second adjustment circuit comprises:
a memory for storing a plurality of reference values representative of a plurality of reference binary error rates associated with a plurality of transmission characteristics;
a measurement circuit for measuring a binary error rate of the transmitted analog signal;
a comparison circuit connected to said memory and to said measurement circuit for comparing a measured binary error rate to a reference value; and
a checking circuit connected to said comparison circuit for checking if the measured binary error rate is less than the reference value, and if so, then the parameters are adjusted to decrease a resolution of said delta-sigma analog/digital converter in successive intervals, and at each interval a new resolution is checked via a new measurement representative of the binary error rate.

32. A wireless communication device according to claim 28, wherein the wireless communication device is a cellular mobile telephone.

33. A wireless communication device according to claim 28, wherein the transmission standard comprises a universal mobile telecommunications system standard.

34. A cellular mobile telephone comprising:
a receiver stage for receiving a transmitted analog signal, and comprising a delta-sigma analog/digital converter for converting the analog signal to a digital signal, said delta-sigma analog/digital converter having adjustable parameters and comprising
a delta-sigma modulator having adjustable parameters, and comprising a sampler circuit having an adjustable oversampling frequency, and
a digital filter having adjustable coefficients connected to an output of said delta-sigma modulator
a processing stage connected to said receiver stage for processing the digital signal, and comprising a tuning circuit for adjusting the parameters of said delta-sigma analog/digital converter as a function of at least one of a transmission standard of the transmitted analog signal, of a transmission rate of data in the received analog signal, and of reception conditions for the received analog signal.

35. A cellular mobile telephone according to claim 34, wherein said tuning circuit comprises:
a first adjustment circuit for adjusting the parameters of said delta-sigma modulator as a function of the transmission standard; and
a second adjustment circuit for adjusting the coefficients of said digital filter and a value of the oversampling frequency as a function of the transmission rate of data in the received analog signal and of reception conditions for the received analog signal.

36. A cellular mobile telephone according to claim 35, wherein said delta-sigma modulator comprises a loop including said sampling circuit and at least one integrator connected thereto, with the loop having at least one loop coefficient; and wherein said first adjustment circuit adjusts the at least one loop coefficient and the value of the oversampling frequency.

37. A cellular mobile telephone according to claim 35, wherein said second adjustment circuit comprises:
a memory for storing a plurality of reference values representative of a plurality of reference binary error rates associated with a plurality of transmission characteristics;
a measurement circuit for measuring a binary error rate of the transmitted analog signal;
a comparison circuit connected to said memory and to said measurement circuit for comparing a measured binary error rate to a reference value; and
a checking circuit connected to said comparison circuit for checking if the measured binary error rate is less than the reference value, and if so, then the parameters are adjusted to decrease a resolution of said analog/digital converter in successive intervals, and at each interval a new resolution is checked via a new measurement representative of the binary error rate.

38. A cellular mobile telephone according to claim 34, wherein the transmission standard comprises a universal mobile telecommunications system standard.

* * * * *

UNITED STATES PATENT AND TRADEMARK OFFICE
CERTIFICATE OF CORRECTION

PATENT NO. : 6,680,682 B2  
DATED : January 20, 2004  
INVENTOR(S) : Thierry Arnaud and Friedbert Berens It is certified that error appears in the above-identified patent and that said Letters Patent is hereby corrected as shown below:

<u>Title page,</u>  
Item [56], References Cited, OTHER PUBLICATIONS, insert -- Ramesh et al., "Sigma Delta Analog to Digital Converters with Adaptive Quantization", Proceedings of the 40$^{th}$ Midwest Symposium on Circuits and Systems, MWSCAS 97, Sacramento, CA, August 3-6, 1997, Vol. 1, pp. 22-30 --

<u>Column 6,</u>  
Line 53, delete "adjusting the adjusting the" insert -- adjusting the --

<u>Column 10,</u>  
Line 59, delete "Claim 14" insert -- Claim 18 --

Signed and Sealed this

Eighteenth Day of May, 2004

JON W. DUDAS  
*Acting Director of the United States Patent and Trademark Office*